(12) United States Patent
Won et al.

(10) Patent No.: US 6,347,044 B1
(45) Date of Patent: Feb. 12, 2002

(54) STRUCTURE FOR MOUNTING A PCB IN AN ELECTRONIC APPARATUS HOUSING

(75) Inventors: Bum-Young Won, Kyunggi-do; Bum-Su Park, Seoul, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/591,618

(22) Filed: Jun. 9, 2000

(30) Foreign Application Priority Data

Jun. 11, 1999 (KR) ............................................ 99-21784

(51) Int. Cl.[7] ................................................ H05K 7/04
(52) U.S. Cl. ........................ 361/807; 361/802; 361/810; 361/742; 361/758; 174/138 G
(58) Field of Search ................................ 361/807, 785, 361/802, 809, 825, 719, 730, 742, 752–759, 810, 804, 799; 174/138 G

(56) References Cited

U.S. PATENT DOCUMENTS

| | | | |
|---|---|---|---|
| 4,342,068 A | * | 7/1982 | Kling .......................... 361/386 |
| 4,679,883 A | * | 7/1987 | Assini et al. ................ 439/607 |
| 4,851,614 A | * | 7/1989 | Duncan, Jr. ................. 174/68.5 |
| 4,970,761 A | * | 11/1990 | Nakamura ..................... 24/453 |
| 5,136,468 A | | 8/1992 | Wong et al. |
| 5,148,350 A | | 9/1992 | Chan et al. |
| 5,442,520 A | | 8/1995 | Kemp et al. |
| 5,444,601 A | | 8/1995 | Honda et al. |
| 5,490,038 A | | 2/1996 | Scholder et al. |
| 5,661,640 A | | 8/1997 | Mills et al. |
| 5,691,504 A | | 11/1997 | Sands et al. |
| 5,724,231 A | | 3/1998 | Winick et al. |
| 5,740,019 A | | 4/1998 | Lee |
| 5,748,451 A | * | 5/1998 | Thompson et al. .......... 361/788 |
| 5,784,256 A | | 7/1998 | Nakamura et al. |
| 5,911,329 A | | 6/1999 | Wark et al. |
| 5,973,926 A | | 10/1999 | Sacherman et al. |

* cited by examiner

*Primary Examiner*—Jayprakash N. Gandhi
*Assistant Examiner*—Hung Bui
(74) *Attorney, Agent, or Firm*—Robert E. Bushnell, Esq.

(57) ABSTRACT

A structure for mounting a printed circuit board (PCB) in an electronic apparatus housing is disclosed. The structure comprises a plurality of holes, a plurality of bosses, and a plurality of seat members. The holes are formed in the printed circuit board. The bosses are formed on the upper surface of the bottom of the electronic apparatus housing at positions corresponding to the positions of the holes. Each of the seat members consists of a seat portion, a vertical cylinder portion and a flange. The seat portion serves to support the bottom surface of the head of a screw while being positioned on the top surface of each of the bosses, and has a center hole through which the screw passes. The vertical cylinder portion is extended from the circumferential end portion of the seat portion, defines a hollow portion in which the head of the screw is positioned, and is inserted into each of the holes of the main board. The flange serves to support the main board while being positioned on the top surface of each of the bosses, is horizontally extended from the circumferential edge of the screw seat, and is soldered to the lower surface of the main board.

46 Claims, 8 Drawing Sheets

STRUCTURE FOR MOUNTING A PCB IN AN ELECTRONIC APPARATUS HOUSING

CLAIM OF PRIORITY

This application makes reference to, incorporates the same herein, and claims all benefits accruing under 35 U.S.C. § 119 from an application entitled A ELECTRONIC SYSTEM HAVING A MOUNTING MECHANISM FOR A PRINTED CIRCUIT BOARD earlier filed in the Korean Industrial Property Office on Jun. 11, 1999, and there duly assigned Ser. No. 21784/1999, a copy of which is annexed hereto.

BACKGROUND OF THE INVENTION

1. Technical Field

The present invention relates, in general, to printed circuit board mounting structures and, more particularly, to a structure for mounting a printed circuit board in a thin electronic apparatus housing, such as the housings of notebook computers.

2. Related Art

A variety of models of portable computers, such as notebook computers, wallet computers, personal digital assistants (PDAs), hand-held personal computers (HPCs) and mobile computers, are marketed for commercial use and are widely used in recent years. In order to improve portability, the portable computers tend to be minimized and slimmed increasingly.

Computer systems are information handling systems that are utilized by many individuals and businesses today. A computer system can be defined as a microcomputer that includes a central processing unit (CPU), a volatile memory, a non-volatile memory such as read only memory (ROM), a display monitor, a keyboard, a mouse or other input device such as a track ball, a floppy diskette drive, a compact disc-read only memory (CD-ROM) drive, a modem, a hard disk storage device, and a printer. A computer system's main board, which is a printed circuit board known as a motherboard, is used to electrically connect these components together. A computer system can be a desktop computer, apersonal computer, aportable computer such as anotebook computer or palm-sized computer, or other type of computer.

Generally, various kinds of printed circuit boards (PCBs), such as a main board or motherboard, are mounted to the housing of such a portable computer.

I have found that many methods used to mount a printed circuit board to a housing of a portable computer utilize the limited space available in an inefficient manner. Efforts have been made to mount a printed circuit board to a housing, but I believe that the efforts to date have not satisfactorily remedied the problem of inefficient space utilization.

Exemplars of recent efforts in the art include U.S. Pat. No. 5,784,256 for Portable Computer Having A Circuit Board Including A Heat-Generating IC Chip And A Metal Frame Supporting The Circuit Board issued to Nakamura et al., U.S. Pat. No. 5,316,468 for Modulator Computer Chassis issued to Wong et al., U.S. Pat. No. 5,148,350 for Portable Electronics Apparatus Housing And Chassis issued to Chan et al., U.S. Pat. No. 5,442,520 for Apparatus For Printed Circuit Board Connection issued to Kemp et al., U.S. Pat. No. 5,444,601 for Personal Computer Having An Expansion Board Connector Restrained By A Wall And Supporting A Circuit Board issued to Honda et al., U.S. Pat. No. 5,490,038 for Adapter Apparatus For Use In Connecting A Printed Circuit Board To A Computer Chassis issued to Scholder et al., U.S. Pat. No. 5,661,640 for Computer Chassis Having A Size-Adjustable, TEM-Shielded Circuit Board Support Plate Structure Therein issued to Mills et al., U.S. Pat. No. 5,724,231 for Support For Electronic Cards And Boards Of Varying Lengths issued to Winick et al., U.S. Pat. No. 5,740,019 for Apparatus For Mounting A Printed Circuit Board In A Monitor Case issued to Lee, U.S. Pat. No. 5,911,329 for Apparatus, And Method For Facilitating Circuit Board Processing issued to Wark et al., U.S. Pat. No. 5,973,926 for Method And Apparatus For Attaching Circuit Board To Chassis And Forming Solid Ground Connection Using A Single Screw issued to Sacherman et al., and U.S. Pat. No. 5,691,504 for Multilayer Computer Chassis Having Integral Circuit Board Mounting And Grounding Structure issued to Sands et al.

While these recent efforts provide advantages, I note that they fail to adequately provide an efficient and convenient structure for mounting a printed circuit board in an electronic apparatus housing.

SUMMARY OF THE INVENTION

Accordingly, the present invention has been made keeping in mind the above problems occurring in the related art, and an object of the present invention is to provide a structure for mounting a printed circuit board (PCB) in an electronic apparatus housing which utilizes space efficiently.

An additional object of the present invention is to provide a structure for mounting, a printed circuit board in an electronic apparatus housing, such that the structure is capable of preventing the heads of mounting screws from being projected over the upper surface of the printed circuit board, thus improving a degree of space utilization and allowing an electronic apparatus to be manufactured in a slim fashion.

In order to accomplish the above objects and other objects, the present invention provides a structure for mounting a printed circuit board in an electronic apparatus housing, comprising a plurality of holes formed in the printed circuit board, a plurality of bosses formed on the upper surface of the bottom of the electronic apparatus housing at positions corresponding to the positions of the holes, and a plurality of seat members, each of the seat members consisting of a seat portion for supporting the bottom surface of the head of a screw while being positioned on the top surface of each of the bosses, the seat portion having a center hole through which the screw passes, a vertical cylinder portion being extended from the circumferential end portion of the seat portion, defining a hollow portion in which the head of the screw is positioned, and being inserted into each of the holes of the main board, and a flange supporting the main board while being positioned on the top surface of each of the bosses, being horizontally extended from the circumferential edge of the screw seat and being soldered to the lower surface of the main board.

In addition, the present invention provides a structure for mounting a printed circuit board in an electronic apparatus housing, comprising a plurality of holes formed in the printed circuit board, a plurality of bosses formed on the upper surface of the bottom of the electronic apparatus housing at positions corresponding to the positions of the holes, and a plurality of seat members, each of the seat members consisting of a seat portion for supporting the bottom surface of the head of a screw while being positioned on the top surface of each of the bosses, the seat portion having a center hole through which the screw passes, a vertical cylinder portion being extended from the circumferential end portion of the seat portion, defining a hollow portion in which the head of the screw is positioned, and being inserted into each of the holes of the main board, and a flange resting on the main board while being positioned on the top surface of each of the bosses and being horizontally extended from a top end of the vertical cylinder portion.

To achieve these and other objects in accordance with the principles of the present invention as embodied and broadly described, the present invention provides an apparatus mounting a board in a housing, comprising: a boss rigidly fixed on a surface of the housing and engaging a screw; a seat being positioned on said boss, said seat comprising: a bottom being positioned on said boss and defining an aperture penetrated by the screw; a cylinder extending from said bottom and being positioned in a hole formed in the board, said cylinder defining an orifice accommodating a head of the screw, said bottom being positioned between the head and said boss; and a flange extending outwardly from circumference of said cylinder and being adjacent to said bottom, said seat being secured to the board, said boss supporting the flange, said flange supporting the board, the screw penetrating the hole and the orifice and the aperture and said boss securing the board to the housing.

To achieve these and other objects in accordance with the principles of the present invention, as embodied and broadly described, the present invention provides an apparatus mounting a board in a housing, comprising: a boss on a surface of the housing and engaging a screw; a seat being positioned on said boss, said seat comprising: a bottom being positioned on said boss and defining an aperture penetrated by the screw; a cylinder extending from said bottom and being positioned in a hole formed in the board, said cylinder defining an orifice accommodating ahead of the screw, said bottom being positioned between the head and said boss; and a flange extending outwardly from circumference of said cylinder, the board supporting the flange, the screw penetrating the hole and the orifice and the aperture and said boss securing the board to the housing.

To achieve these and other objects in accordance with the principles of the present invention, as embodied and broadly described, the present invention provides an apparatus, comprising: a bottom being positioned on a housing, said bottom defining an aperture penetrated by a screw, the housing having a threaded portion engaging the screw; a cylinder extending from said bottom and being positioned in a hole formed in a board, said cylinder defining an orifice accommodating a head of the screw, said bottom being positioned between the head and said housing; and a flange extending outwardly from said cylinder and being adjacent to said bottom, said seat being secured to the board, said housing supporting the flange, said flange supporting the board, the screw penetrating the hole and the orifice and the aperture securing the board to the housing.

The present invention is more specifically described in the following paragraphs by reference to the drawings attached only by way of example. Other advantages and features will become apparent from the following description and from the claims.

BRIEF DESCRIPTION OF THE DRAWINGS

In the accompanying drawings, which are incorporated in and constitute a pair of this specification, embodiments of the invention are illustrated, which, together with a general description of the invention given above, and the detailed description given below, serve to exemplify the principles of this invention.

DETAILED DESCRIPTION OF THE PREFERRED EMBODIMENT

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of this invention. Accordingly, the description which follows is to be understood as being abroad, teaching disclosure directed to persons of skill in the appropriate arts, and not as limiting upon the present invention.

Figure 1:
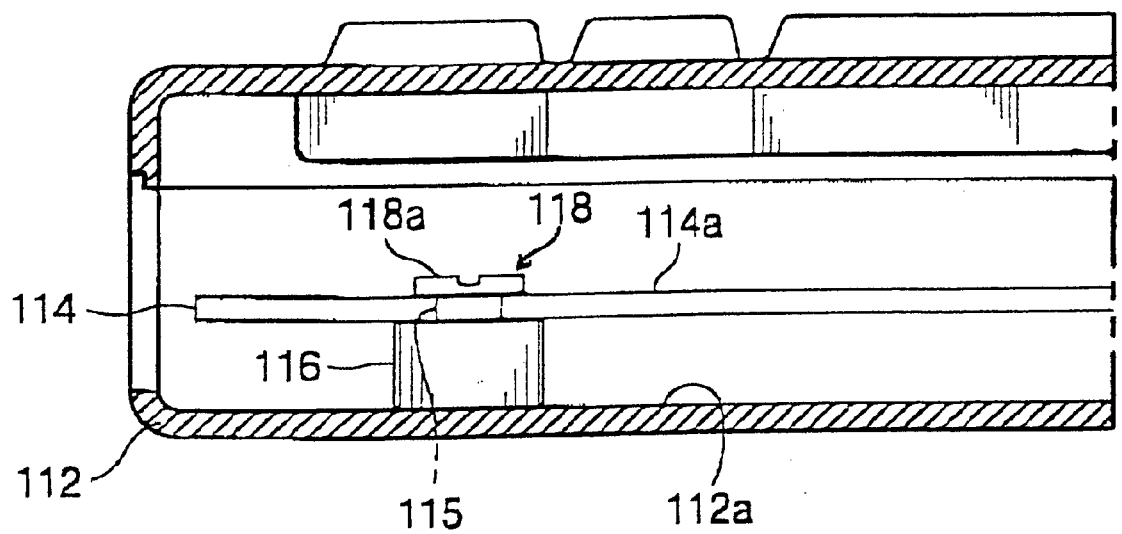
FIG. 1 is a partial vertical sectional view showing a printed circuit board mounting structure.

The main board of a portable computer can be mounted to the housing of the portable computer using a bolt engagement process. FIG. 1 is a partial vertical sectional view showing a printed circuit board mounting structure. FIG. 1 shows a main board 114 mounted to a main body us housing 112. A plurality of holes 15 are formed in the main board 114. A plurality of bosses 116 are formed on the upper surface 112a of the bottom of the main board housing 112 at positions corresponding to the positions of the holes 115. The main board 114 is fastened to the bosses 116 of the housing 112 by tightening screws 118 respectively into the screw holes of the bosses 116 through the holes 115 of the main board 114 while the main board 114 is disposed on the bosses 116 of the housing 112 with the holes 115 of the main board 114 respectively being concentric with the bosses 116 of the housing 112.

However, in accordance with the printed circuit board mounting structure of FIG. 1, the heads 118a of the screws 118 are projected above the upper surface 114a of the main board 114. The projected heads 118a of the screws 118 reduce a space for mounting electronic devices. As a result, there are generated limitations in design wherein electronic devices are disposed in the remaining space except for the space over the projected heads 118a of the screws 118 or the top of the housing 112 is heightened to compensate for the reduction of the space. In brief, there is a problem which occurs in the portable computer in which the space that should be used for mounting electronic devices is reduced due to the projection of the heads 118a of the screws 118 over the upper surface 114a of the main board 114. Such a problem is contrary to a user's demand for minimized and slimmed portable computers.

Reference now shall be made to the drawings, in which the same reference numerals are used throughout the different drawings to designate the same or similar components.

Figure 2:
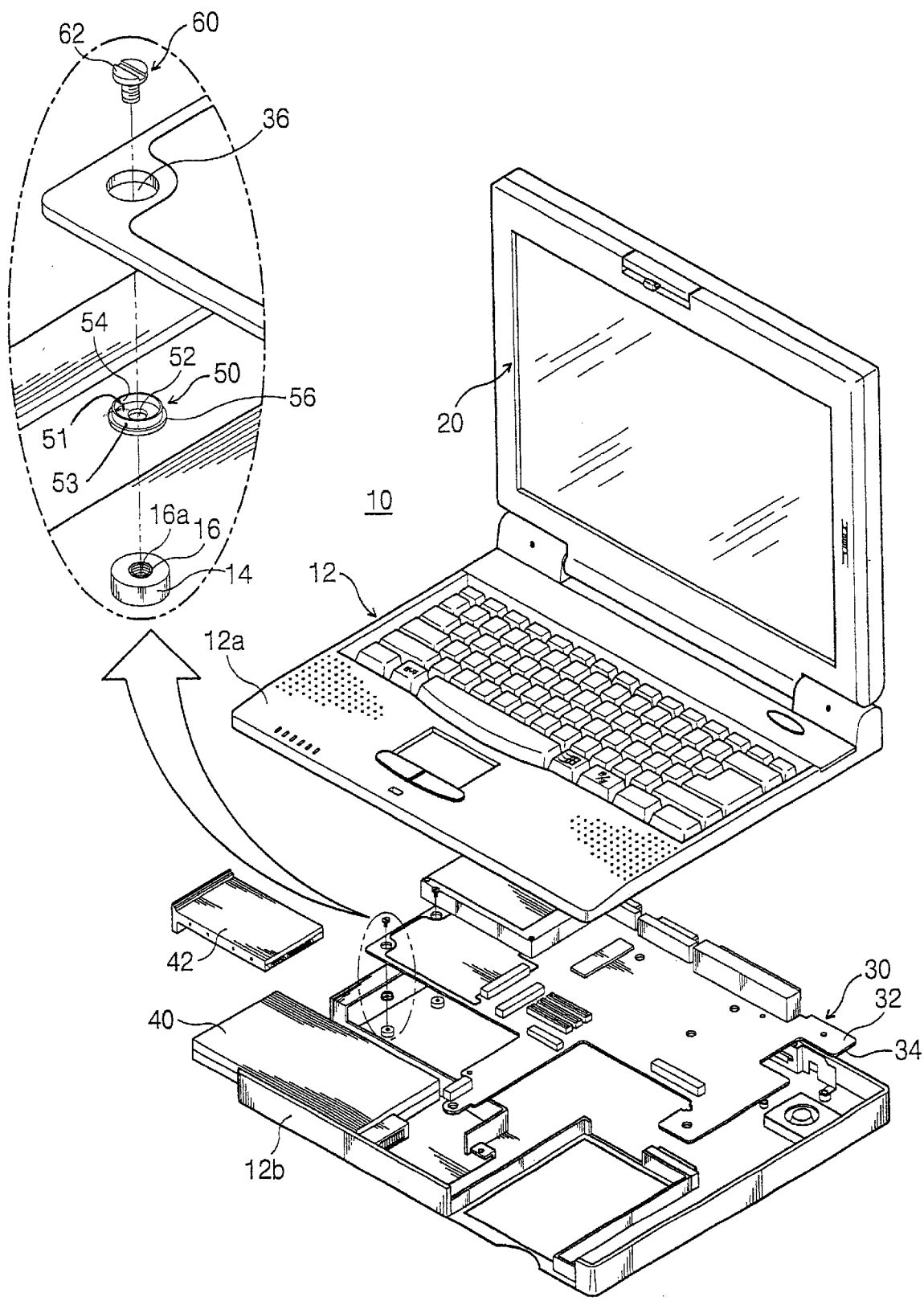
FIG. 2 is an exploded perspective view showing a portable computer having a printed circuit board mounting structure of a first embodiment of the present invention, in accordance with the principles of the present invention.
Figure 3:
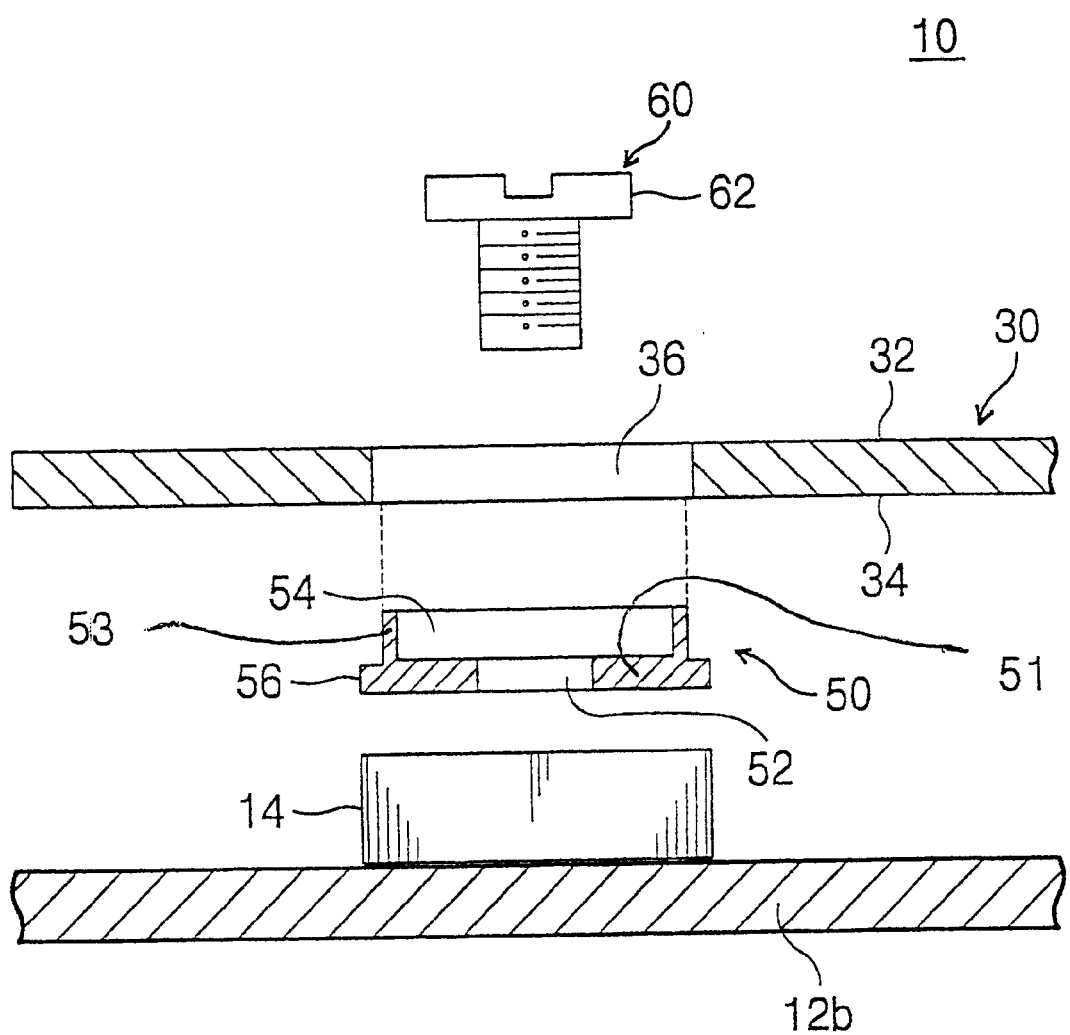
FIG. 3 is a partial vertical sectional view showing the printed circuit board mounting structure of FIG. 2, in accordance with the principles of the present invention.
Figure 4A:
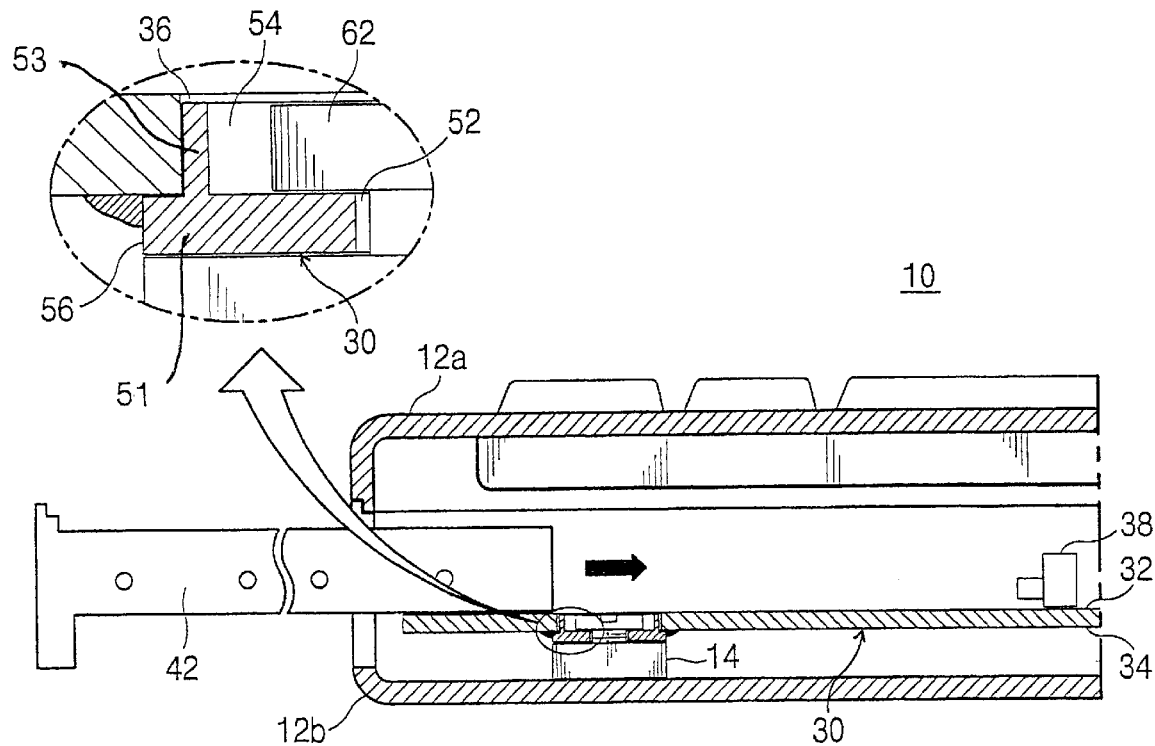
FIGS. 4a and 4b are partial vertical sectional views showing a state where a main board is mounted to a housing of the portable computer using the printed circuit board mounting structure of FIG. 2, in accordance with the principles of the present invention.
Figure 4B:
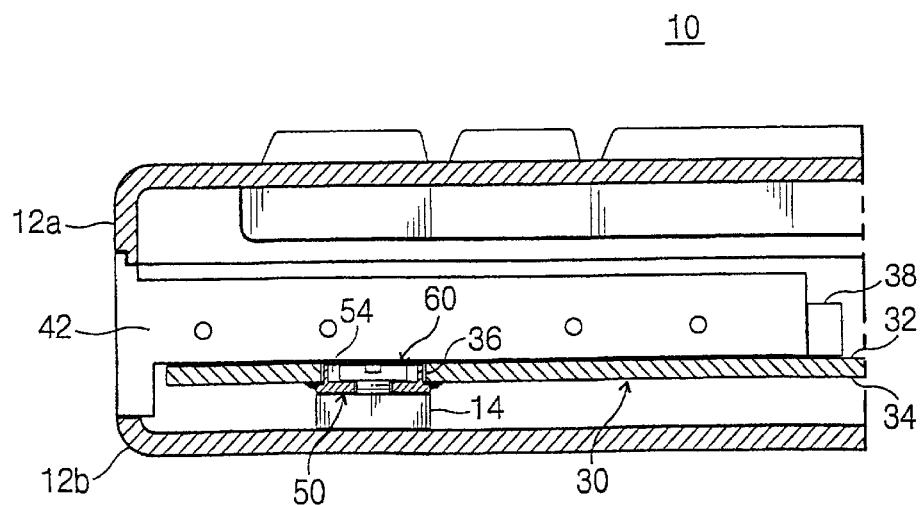

FIG. 2 is an exploded perspective view showing a portable computer having a printed circuit board mounting structure of a first embodiment of the present invention, in accordance with the principles of the present invention. FIGS. 3 to 4b are views for explaining the printed circuit board mounting structure of FIG. 2. The FIG. 3 is a partial vertical sectional view showing the printed circuit board mounting structure of FIG. 2, in accordance with the principles of the present invention. The FIGS. 4a and 4b are partial vertical sectional views showing a state where a main board is mounted to a housing of the portable computer using the printed circuit board mounting structure of FIG. 2, in accordance with the principles of the present invention.

As illustrated in FIG. 2, the portable computer 10 consists of a display unit 20 and a main body (a reference numeral is not assigned to this element). The main body includes a main body housing 12 and a main board 30. The main board 30 is a printed circuit board and could be known as a motherboard. The display unit 20 is rotatably connected to the main body housing 12 via a hinge mechanism (a reference numeral is not assigned to this element). As a display screen that is generally fixed to the inside surface of the display unit 20, there may be employed a display device, such as a video monitor, a liquid crystal display, a cathode ray tube, a gas-plasma display, a light emitting diode display, an electro-luminescent display, a field emission display, or other video display device.

The main body housing 12 consists of an upper housing 12a and a lower housing 12b. When the upper housing 12a and the lower housing 12b are assembled together, the upper housing 12a and the lower housing 12b define an interior space for receiving a variety of electronic devices including the main board 30. For example, as the electronic devices, there may be enumerated a power supply device such as a battery 40, storage devices such as a hard disk drive and a floppy disk drive, and a pointing device. A hard disk drive 42 is shown in FIG. 2. The battery 40 could be replaced by a peripheral device.

Referring to FIGS. 2 to 4b, the printed circuit board mounting structure according to the first embodiment of the present invention will be described. A plurality of holes 36 are formed in a main board 30. A central processing unit, a plurality of semiconductor integrated circuit apparatuses, and other electronic devices may be mounted to the main board 30. A plurality of bosses 14 are formed on the upper surface of the lower housing 12b at positions corresponding to the positions of the holes 36. Each of the bosses 14 may be manufactured in the form of a single body or a boss in which a screw-holed insert 16 having threads 16a is fitted into a boss body.

In accordance with the present invention, a plurality of seat members 50 are provided additionally. The seat member 50 can also be referred to as screw seat 50 or seat 50. The seat members 50 respectively have medicine bottle cap shapes. Each of the seat members 50 consists of a seat portion 51, a vertical cylinder portion 53 and a flange 56. The seat portion 51 can also be referred to as the bottom 51 of the seat 50. The seat portion 51 serves to support the bottom surface of the head of a screw (which will be described below), and has a center hole 52 through which the screw passes. The vertical cylinder portion 53 is extended from the circumferential end portion of the seat portion 51, defines a hollow portion 54 in which the head of the screw is positioned when the screw is completely tightened, and is inserted into each of the holes 36 of the main board 30. The vertical cylinder portion 53 can also be referred to as cylinder 53. The flange 56 is used to rest on said main board 30, and is horizontally extended from the circumferential edge of the screw seat 50. The flange 56 is soldered to the lower surface 34 of the main board 30 while the vertical cylinder portion 53 of the seat member 50 is inserted into the hole 36 of the main board 30. That is, the seat member 50 is fixed to the main board 30 by means of solder. The seat member 50 can be made of high-conductive metal, such as aluminum, a stainless steel, a copper, etc., and may be formed using a cutting or casting process. When the seat member 50 is made of metal, electromagnetic interference (EMI) noise signals, which are generated in the main board 30, may be efficiently transmitted toward the main body housing 12 through the seat member 50 and the screw.

Referring to FIG. 4a, the main board 30, into which the seat members 50 have been fitted, is fastened to the bosses 14 of the housing 12 by tightening screws 60 respectively into the screw holes (not shown) of the bosses 14 of the housing 12 respectively through the center holes 52 of the seat members 50 while the seat members 50 fixed to the main board 30 are respectively disposed on the bosses 14 of the housing 12. At this time, the heads 62 of the screws 60 are not projected from the upper surface 32 of the main board 30, but are respectively positioned in the hollow portions 54 of the seat members 50 that are respectively fitted into the holes 36 of the main board 30. As a result, a hard disk drive 42 can be positioned on the portions of the upper surface 32 of the main board 30 where the screws 60 are tightened into the bosses 14. A connector 38 couples with the hard disk drive 42. The holes 36 can also be referred to as apertures 36 or orifices 36.

According to this embodiment, since the heads 62 of the screws 60 are not projected from the upper surface 32 of the main board 30, the space over the main board 30 can be utilized at its maximum and the portable computer can be manufactured in a slim fashion.

Figure 5:
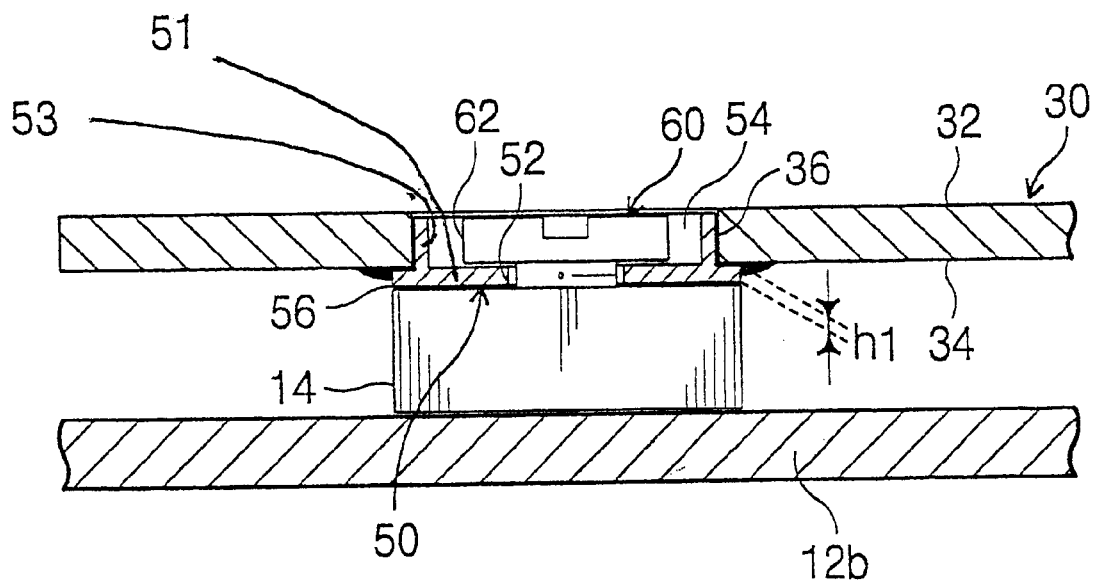
FIG. 5 is a partial vertical sectional view showing a modification of a seat member of the first embodiment, in accordance with the principles of the present invention.
Figure 5:
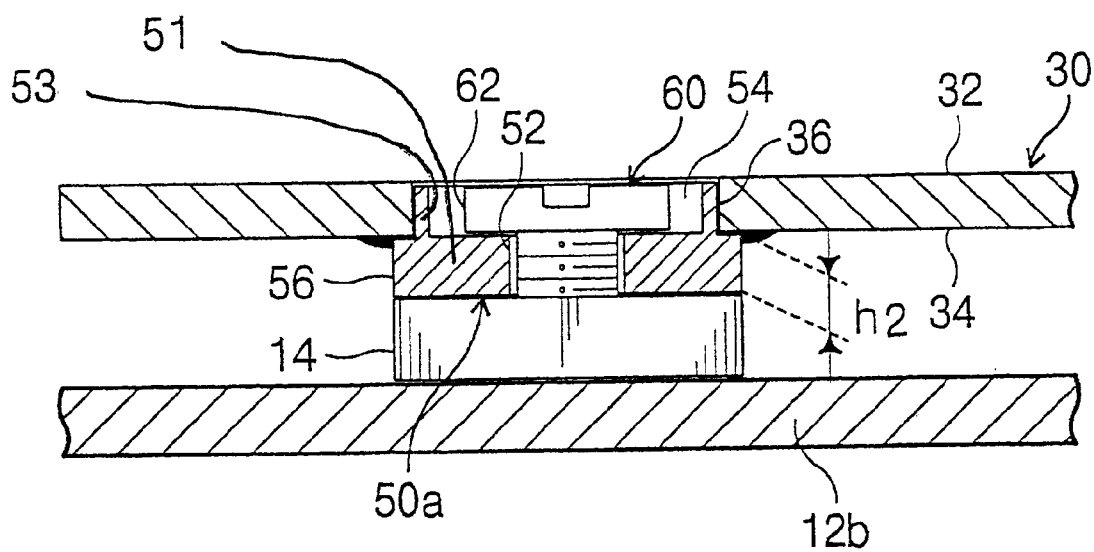

FIG. 5 is a partial vertical sectional view showing a modification of a seat member of the first embodiment, in accordance with the principles of the present invention. Referring to FIG. 5, when the seat portions 51 and the flanges 56 are thickened, the height between the lower housing 12b and the main board 30 can be increased. Therefore, when it is necessary to situate the main board 30 at a relatively high position, seat members 50a that respectively have thickened seat portions 51 and thickened flanges 56 can be used instead of the seat members 50. As shown in FIG. 5, the height h1 of seat member 50 is less than the height h2 of seat member 50a.

Figure 6:
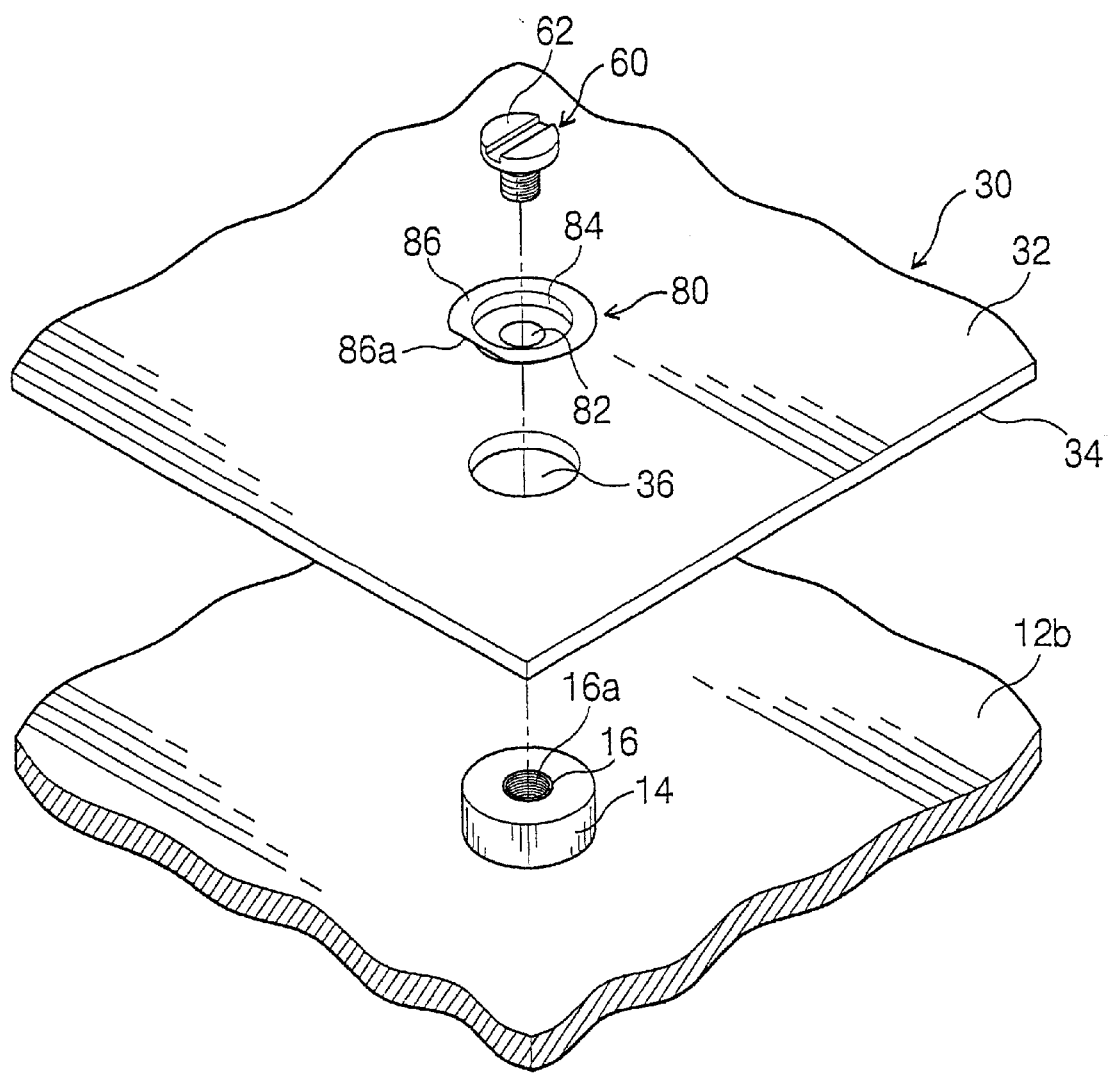
FIG. 6 is an exploded perspective view showing a printed circuit board mounting structure according to a second embodiment of the present invention, in accordance with the principles of the present invention.
Figure 7A:
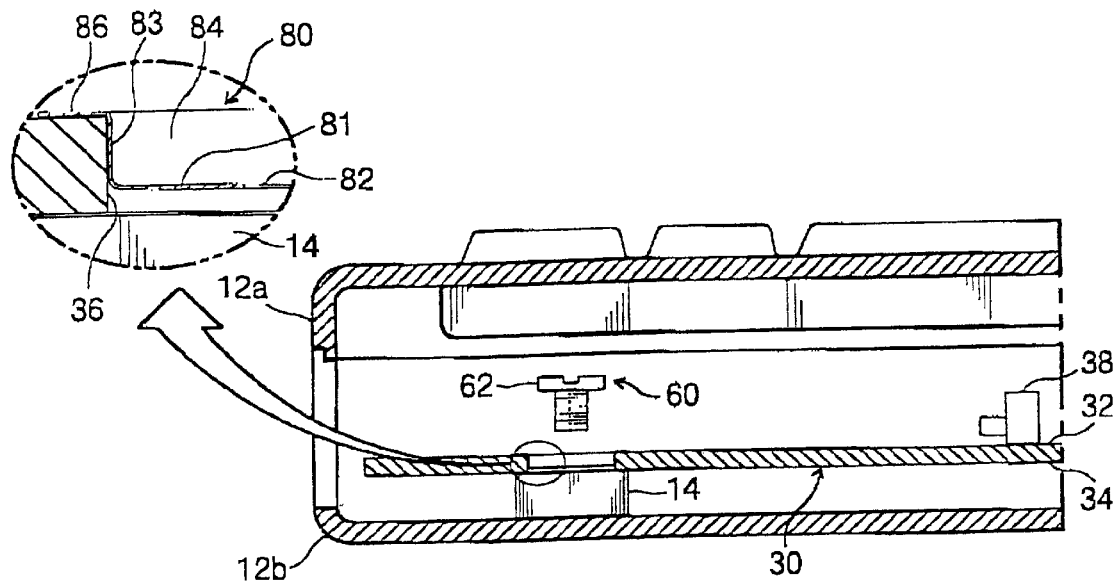
FIGS. 7a and 7b are partial vertical sectional views showing a state where a main board is mounted to a housing of the portable computer using the printed circuit board mounting structure of FIG. 6, in accordance with the principles of the present invention.
Figure 7B:
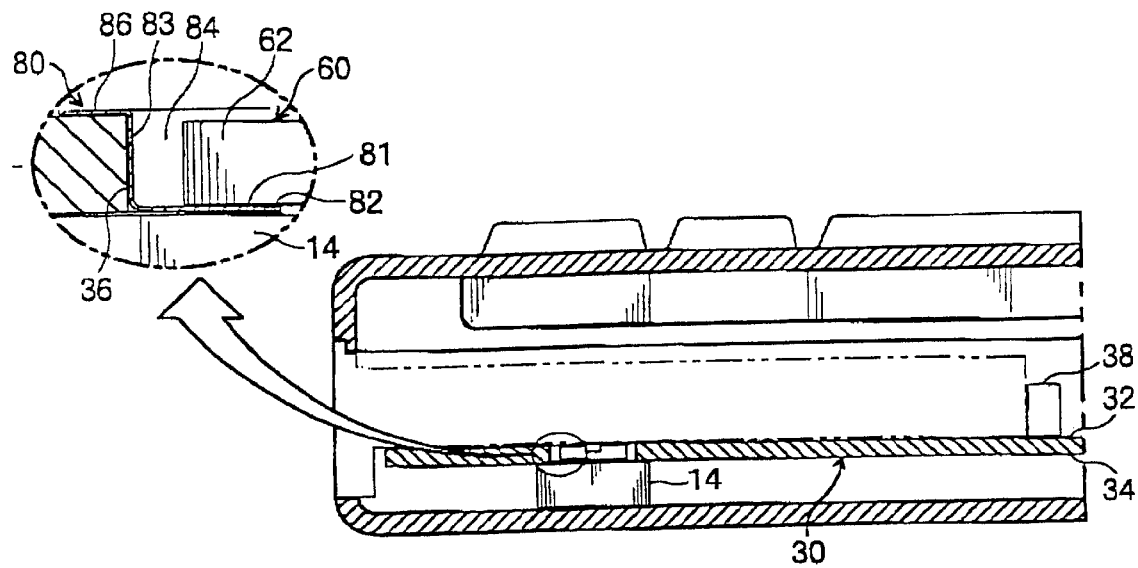
Figure 8:
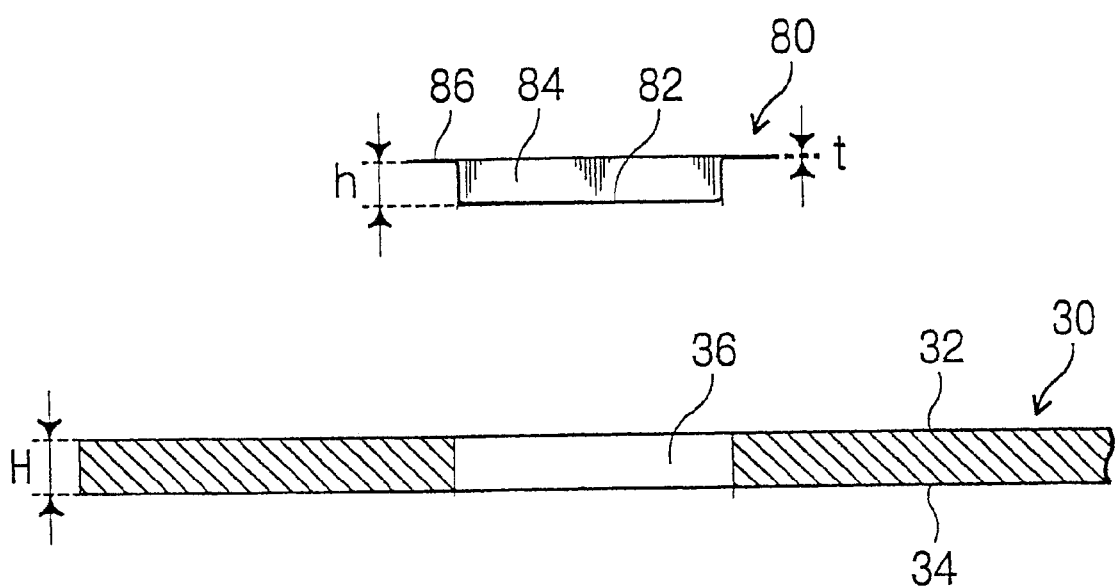
FIG. 8 is an enlarged partial sectional view showing a hole and a seat member of the second embodiment, in accordance with the principles of the present invention.

The FIGS. 6 to 8 are views showing another printed circuit board mounting structure according to a second embodiment of the present embodiment. FIG. 6 is an exploded perspective view showing a printed circuit board mounting structure according to a second embodiment of the present invention, in accordance with the principles of the present invention. FIGS. 7a and 7b are partial vertical sectional views showing a state where a main board is mounted to a housing of the portable computer using the printed circuit board mounting structure of FIG. 6, in accordance with the principles of the present invention. FIG. 8 is an enlarged partial sectional view showing a hole and a seat member of the second embodiment, in accordance with the principles of the present invention.

The printed circuit board mounting structure of the second embodiment differs from the printed circuit board mounting structure of the first embodiment only in that the flanges 86 of its seat members 80 are horizontally extended from the top ends of the vertical cylinder portions 83 of the seat members 80. Therefore, the holes 36 of a main board 30 and the bosses 14 of a lower housing 12b of the second embodiment are the same as the holes 36 of the main board 30 and the bosses 14 of the lower housing 12b of the first embodiment in construction. In order to prevent their description from being repeated, the description of the holes 36 and the bosses 14 is omitted in this specification.

The second embodiment is distinguished from the first embodiment by the seat members 80. The seat members 80 are hat-shaped. In FIG. 6, the boss 14 may be manufactured in the form of a single body or a boss in which a screw-holed insert 16 having threads 16a is fitted into a boss body. Each of the seat members 80 consists of a seat portion 81, a vertical cylinder portion 83 and a flange 86. The seat portion 81 serves to support the bottom surface of the head of a screw (which will be described below), and has a center hole 82 through which the screw passes. The vertical cylinder portion 83 is extended from the circumferential end portion of the seat portion 81, defines a hollow portion 84 in which the head of the screw is positioned when the screw is completely tightened, and is inserted into each of the holes 36 of the main board 30. The flange 86 is used to rest on said main board 30 and is horizontally extended from the top end of the vertical cylinder portion 83. A portion of the flange 86 is cut off along a straight line 86a so as to prevent the seat member 80 from being rotated by the screw while the screw is fastened into the boss 14. The straight portion 86a can prevent the seat member 80 from being rotated in several ways. The straight portion 86a could be designed to engage a section of the printed circuit board 30 and thus the seat member 80 would be prevented from rotating while the screw 60 was being screwed into the boss 14. The straight portion 86a could be designed to engage a unit mounted to the printed circuit board 30 and thus the seat member 80 would be prevented from rotating while the screw 60 was being screwed into the boss 14. The straight portion 86a could be designed to engage an edge of the printed circuit board 30 and thus the seat member 80 would be prevented from rotating while the screw 60 was being screwed into the boss 14. A user could use a tool to engage the straight portion 86a and thus the seat member 80 would be prevented from rotating while the screw 60 was being screwed into the boss 14. In FIGS. 7A and 7B, a connector 38 couples with the hard drive 42.

In accordance with the construction of the seat member 80 of this embodiment, the seat member 80 may be easily manufactured from a stainless or aluminum plate using a pressing process. The seat member 80 could be secured to the printed circuit board 30. The seat member 80 could be soldered to the printed circuit board 30. The flange 86 could be secured to the printed circuit board 30. The flange 86 could be soldered to the printed circuit board 30.

The seat members 80 are combined with the main board 30 with the vertical cylinder portions 83 of the seat members 80 fitted into the holes 36 of the main board 30 in a tight or slide fit fashion. The main board 30 is fastened to the bosses 14 by tightening screws 60 into the screw holes of the bosses 14 through the center holes 82 of the seat members 80. At this time, the flanges 86 press the upper surface 32 of the main board 30, thereby fixing the main board 30 to the lower housing 12b.

As illustrated in FIG. 8, when the height h of each of the seat members 80 is lower than the thickness H of the main board 30, the seat member 80 can press the main board 30 with sufficient force. Since the thickness of the seat member 80 is small, the seat members 80 can press the main board 30 while the heights of the seat members 80 are enlarged due to the tightening force of the screws 60. On the other hand, when the height of each of the seat members 80 is larger than or equal to the thickness of the main board 30, the seat members 30 cannot press the main board 30 with sufficient force, thereby causing the main board 30 not to be sufficiently fixed to the lower housing 12b.

Generally, the hard disk drive 42 is positioned over the main board 30 through an opening (not shown) of the housing 12 with the hard disk drive 43 spaced apart from the main board 30 by 0.2 millimeters (mm). When each of the flanges 86 of the seat members 80 has a thickness of more than 0.2 mm, the flanges 86 of the seat members 80 interfere with the hard disk drive 43 that is slid into the interior of the housing 12 through the opening. As a result, the thickness t of each of the seat members 80, particularly, the thickness of each of the flanges 86 of the seat members 80 preferably is within a range of 0.05 mm to 0.2 mm.

According to this embodiment, since the heads 62 of the screws 60 are not projected from the upper surface 32 of the main board 30, the space over the main board 30 can be utilized at its maximum and the portable computer can be manufactured in a slim fashion, also.

In addition, according to the construction of the seat members 80 of this embodiment, since it is not necessary to fix the seat members 80 of this embodiment to the main board 30 differently from the seat members 50 of the first embodiment and the seat members 80 of this embodiment may be easily manufactured using a pressing process, the manufacturing cost of the portable computer can be reduced.

The printed circuit board mounting structure constructed in accordance with the present invention may be usefully applied to a variety of electronic devices to which one or more PCBs are mounted, such as a notebook computer, a wallet computer, a PDA, an HPC and a mobile computer.

As described above, the present invention provides a structure for mounting a printed circuit board in an electronic apparatus housing, capable of preventing the heads of mounting screws from being projected over the upper surface of the printed circuit board, thereby improving a degree of space utilization and allowing an electronic apparatus to be manufactured in a slim fashion.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. While the present invention has been illustrated by the description of embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details, representative apparatus and method, and illustrative examples shown and described. Accordingly, departures may be made from such details without departing from the spirit or scope of the applicant's general inventive concept.

What is claimed is:

1. An apparatus mounting a board in a housing, comprising:
   a boss rigidly fixed on a surface of the housing and engaging a screw;
   a seat being positioned on said boss, said seat comprising:
      a bottom being positioned on said boss and defining an aperture penetrated by the screw;
      a cylinder extending from said bottom and being positioned in a hole formed in the board, said cylinder defining an orifice accommodating a head of the screw, said bottom being positioned between the head and said boss; and
      a flange extending outwardly from circumference of said cylinder and being adjacent to said bottom, said sea being secured to the board, said boss supporting the flange, said flange supporting the board, the screw penetrating the hole and the orifice and the aperture and said boss securing the board to the housing.

2. The apparatus of claim 1, the head of the screw being below an upper surface of the board when the orifice accommodates the head of the screw.

3. The apparatus of claim 2, said flange being soldered to the board.

4. The apparatus of claim 1, the board corresponding to a printed circuit board.

5. The apparatus of claim 4, the head of the screw not penetrating a plane corresponding to an upper surface of the board when the orifice accommodates the head of the screw.

6. The apparatus of claim 4, said seat being soldered to the board.

7. The apparatus of claim 1, said flange being soldered to a lower surface of the board.

8. The apparatus of claim 1, said cylinder being soldered to the board.

9. The apparatus of claim 1, the housing corresponding to a housing for a portable computer.

10. The apparatus of claim 9, said bottom supporting the head of the screw.

11. The apparatus of claim 10, the orifice and the hole being concentric to the aperture.

12. The apparatus of claim 11, said boss being formed on the surface of the housing.

13. The apparatus of claim 1, a diameter of the orifice being larger than a diameter of the aperture.

14. The apparatus of claim 1, said boss, said seat, the hole formed in the board, and the screw being aligned.

15. The apparatus of claim 14, further comprising:
   said boss corresponding to a plurality of bosses;
   said seat corresponding to a plurality of seats;
   the hole formed in the board corresponding to a plurality of holes; and
   the screw corresponding to a plurality of screws.

16. An apparatus mounting aboard in a housing, comprising:
   a boss on a surface of the housing and engaging a screw;
   a seat being positioned on said boss, said seat comprising:
      a bottom being positioned on said boss and defining an aperture penetrated by the screw;
      a cylinder extending from said bottom and being positioned in a hole formed in the board, said cylinder defining an orifice accommodating a head of the screw, said bottom being positioned between the head and said boss; and
      a flange extending outwardly from circumference of said cylinder, the board supporting the flange, the screw penetrating the hole and the orifice and the aperture and said boss securing the board to the housing.

17. The apparatus of claim 16, the head of the screw being below an upper surface of the board when the orifice accommodates the head of the screw.

18. The apparatus of claim 17, said flange being soldered to the board.

19. The apparatus of claim 16, the board corresponding to a printed circuit board.

20. The apparatus of claim 19, the head of the screw not penetrating a plane corresponding to an upper surface of the board when the orifice accommodates the head of the screw.

21. The apparatus of claim 19, said seat being soldered to the board.

22. The apparatus of claim 16, said flange being soldered to an upper surface of the board.

23. The apparatus of claim 16, said cylinder being soldered to the board.

24. The apparatus of claim 16, the housing corresponding to a housing for a portable computer.

25. The apparatus of claim 24, said bottom supporting the head of the screw.

26. The apparatus of claim 25, the orifice and the hole being concentric to the aperture.

27. The apparatus of claim 26, said boss being formed on the surface of the housing.

28. The apparatus of claim 16, a diameter of the orifice being larger than a diameter of the aperture.

29. The apparatus of claim 16, said boss, said seat, the hole formed in the board, and the screw being aligned.

30. The apparatus of claim 29, further comprising:
   said boss corresponding to a plurality of bosses;
   said seat corresponding to a plurality of seats;
   the hole formed in the board corresponding to a plurality of holes; and
   the screw corresponding to a plurality of screws.

31. The apparatus of claim 16, said seat being secured to the board.

32. The apparatus of claim 16, said flange having at least one straight edge preventing said seat from being rotated by the screw when the screw is being screwed into said boss.

33. An apparatus, comprising:
   a bottom being positioned on a housing, said bottom defining an aperture penetrated by a screw, the housing having a threaded portion engaging the screw;
   a cylinder extending from said bottom and being positioned in a hole formed in a board, said cylinder defining an orifice accommodating a head of the screw, said bottom being positioned between the head and said housing; and
   a flange extending outwardly from said cylinder and being adjacent to said bottom, said flange being secured to the board, said housing supporting the flange, said flange supporting the board, the screw penetrating the hole and the orifice and the aperture securing the board to the housing.

34. The apparatus of claim 33, the head of the screw being below an upper surface of the board when the orifice accommodates the head of the screw.

35. The apparatus of claim 34, said flange being soldered to the board.

36. The apparatus of claim 33, the board corresponding to a printed circuit board.

37. The apparatus of claim 36, the head of the screw not penetrating a plane corresponding to an upper surface of the board when the orifice accommodates the head of the screw.

38. The apparatus of claim 33, said flange being soldered to a lower surface of the board.

39. The apparatus of claim 33, said cylinder being soldered to the board.

40. The apparatus of claim 33, the housing corresponding to a housing for a portable computer.

41. The apparatus of claim 40, said bottom supporting the head of the screw.

42. The apparatus of claim 41, the orifice and the hole being concentric to the aperture.

43. The apparatus of claim 33, a diameter of the orifice being larger than a diameter of the aperture.

44. An apparatus, comprising:
- a printed circuit board being mounted in a main body housing;
- a boss rigidly fixed on a surface of the housing, said boss engaging a screw;
- a seat being supported by said board, said seat comprising:
  - a top defining an aperture penetrated by the screw;
  - a bottom defining the aperture penetrated by the screw, said bottom supporting ahead of the screw;
  - a cylinder extending from said top to said bottom and being positioned in a hole formed in said board, said cylinder defining an orifice accommodating the head, said bottom being positioned between the head and said boss, the head being positioned below an upper surface of said board when the orifice accommodates the head, the screw penetrating the hole, the orifice, the aperture, and said boss to secure said board to the housing; and
  - a flange extending outwardly from circumference of said cylinder and being adjacent to said top, said flange being supported by said board.

45. The apparatus of claim 44, said flange having at least one straight edge preventing said seat from being rotated by the screw when the screw is being screwed into said boss.

46. The apparatus of claim 45, said bottom not contacting said boss when said boss does not engage the screw.

* * * * *